US009590174B2

(12) United States Patent
Toko et al.

(10) Patent No.: US 9,590,174 B2
(45) Date of Patent: Mar. 7, 2017

(54) MAGNETORESISTIVE MEMORY DEVICE AND MANUFACTURING METHOD OF THE SAME

(71) Applicants: Masaru Toko, Seoul (KR); Kuniaki Sugiura, Seoul (KR); Yutaka Hashimoto, Seoul (KR); Katsuya Nishiyama, Seoul (KR); Tadashi Kai, Seoul (KR)

(72) Inventors: Masaru Toko, Seoul (KR); Kuniaki Sugiura, Seoul (KR); Yutaka Hashimoto, Seoul (KR); Katsuya Nishiyama, Seoul (KR); Tadashi Kai, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 24 days.

(21) Appl. No.: 14/629,120

(22) Filed: Feb. 23, 2015

(65) Prior Publication Data

US 2016/0104834 A1 Apr. 14, 2016

Related U.S. Application Data

(60) Provisional application No. 62/061,552, filed on Oct. 8, 2014.

(51) Int. Cl.

| | |
|---|---|
| ***H01L 21/02*** | (2006.01) |
| ***H01L 21/00*** | (2006.01) |
| ***H01L 43/12*** | (2006.01) |
| ***H01L 43/08*** | (2006.01) |
| ***H01L 43/02*** | (2006.01) |
| *H01L 27/22* | (2006.01) |

(52) U.S. Cl.

CPC .............. *H01L 43/12* (2013.01); *H01L 43/02* (2013.01); *H01L 43/08* (2013.01); *H01L 27/228* (2013.01)

(58) Field of Classification Search

CPC ..................................................... H01L 27/228
USPC ............................................... 438/3; 257/295
See application file for complete search history.

(56) References Cited

U.S. PATENT DOCUMENTS 7,754,501 B2 * 7/2010 Urushido .......... H01L 27/11502 438/3
8,093,070 B2 * 1/2012 Celii ................. H01L 27/11507 438/3
8,422,285 B2 * 4/2013 Apalkov .............. G01R 33/098 365/171
8,796,042 B2 * 8/2014 Shin ....................... H01L 43/12 438/3

(Continued)

*Primary Examiner* — Calvin Lee
(74) *Attorney, Agent, or Firm* — Holtz, Holtz & Volek PC

(57) ABSTRACT

According to one embodiment, a manufacturing method of a magnetoresistive memory device includes forming a first magnetic layer on a substrate, forming a magnetoresistive effect element on the first magnetic layer, forming a mask on a part of the magnetoresistive effect element, selectively etching the magnetoresistive effect element using the mask, forming a sidewall insulating film on a sidewall of the magnetoresistive effect element exposed by the etching, selectively etching the first magnetic layer using the mask and the sidewall insulating film and forming a deposition layer containing a magnetic material on a sidewall of the first magnetic layer and the sidewall insulating film, and introducing ions into the deposition layer.

13 Claims, 10 Drawing Sheets

(56) References Cited

U.S. PATENT DOCUMENTS

| | | | | |
|---|---|---|---|---|
| 9,385,308 | B2 * | 7/2016 | Li | G11C 11/5607 43/12 |
| 2013/0313506 | A1 | 11/2013 | Murayama et al. | |
| 2014/0087483 | A1 | 3/2014 | Ohsawa et al. | |

* cited by examiner

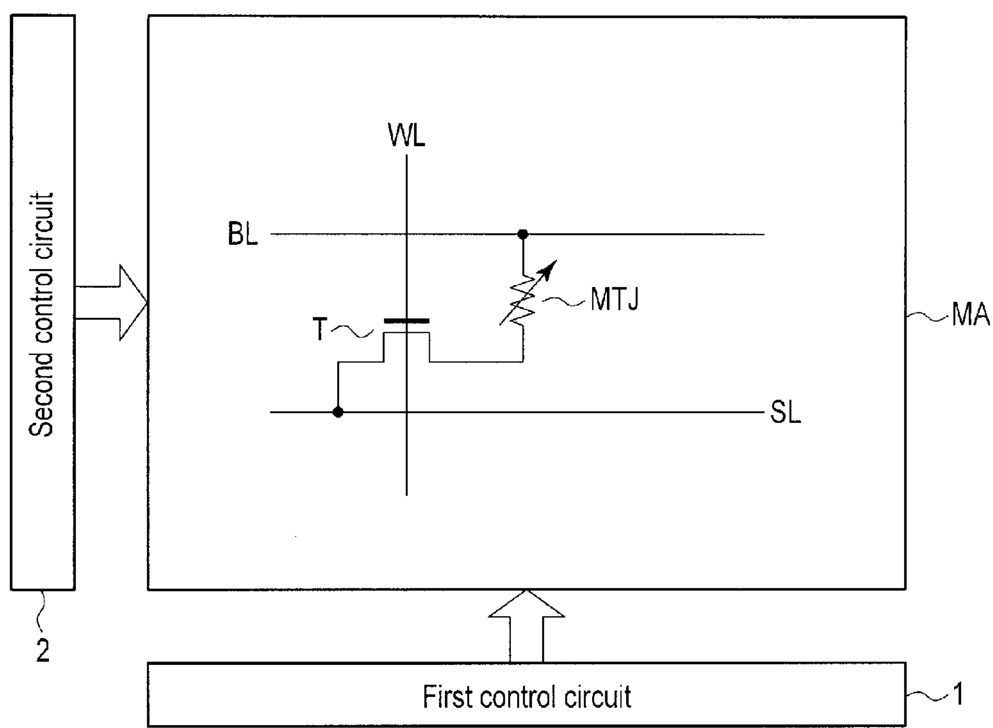
F I G. 1
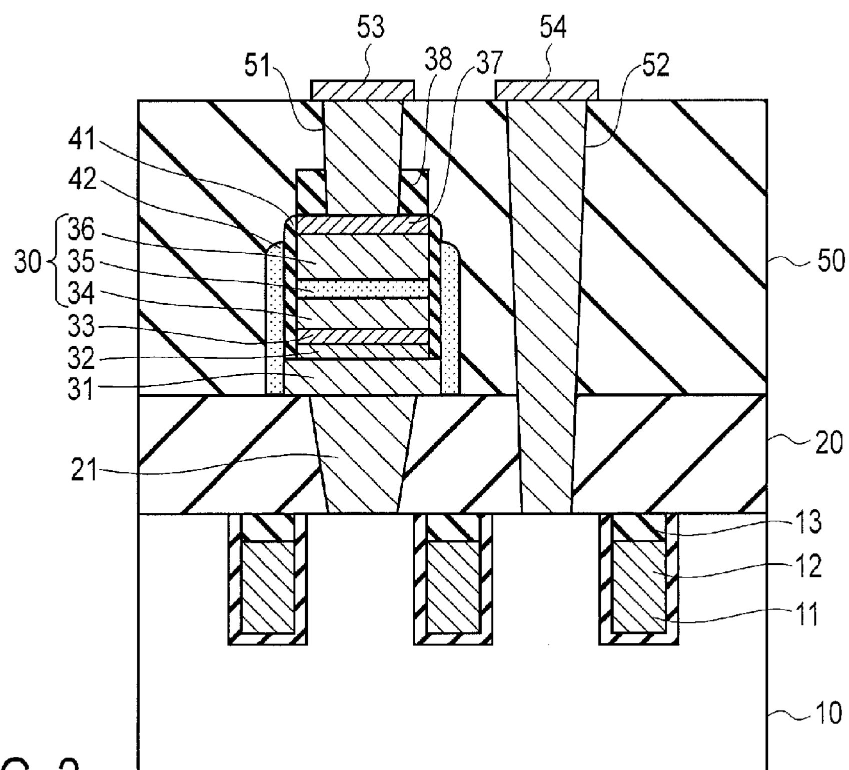
F I G. 2

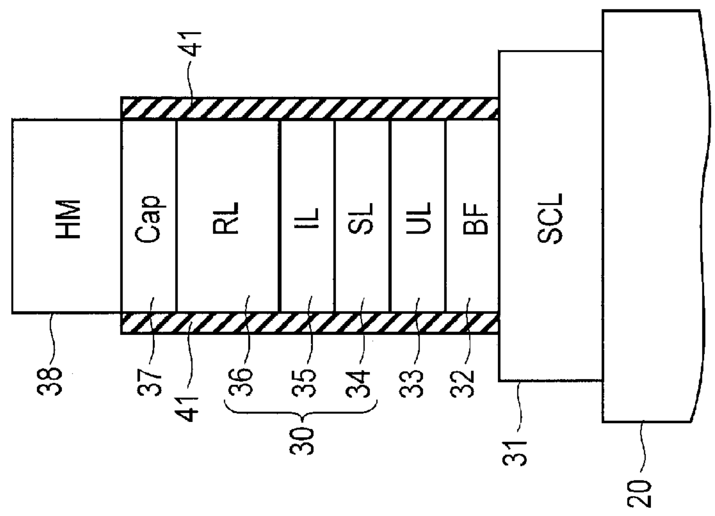
F I G. 3C
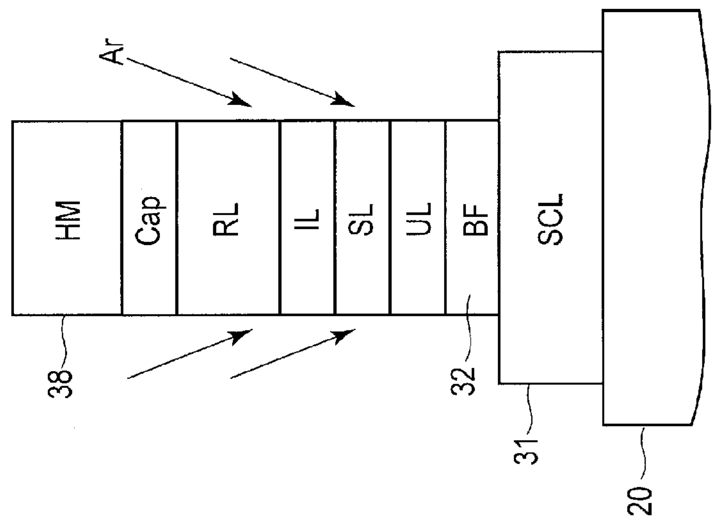
F I G. 3B
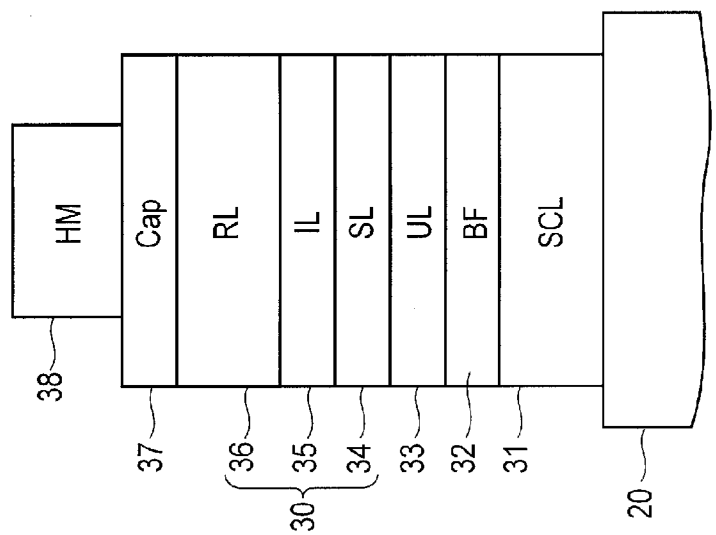
F I G. 3A

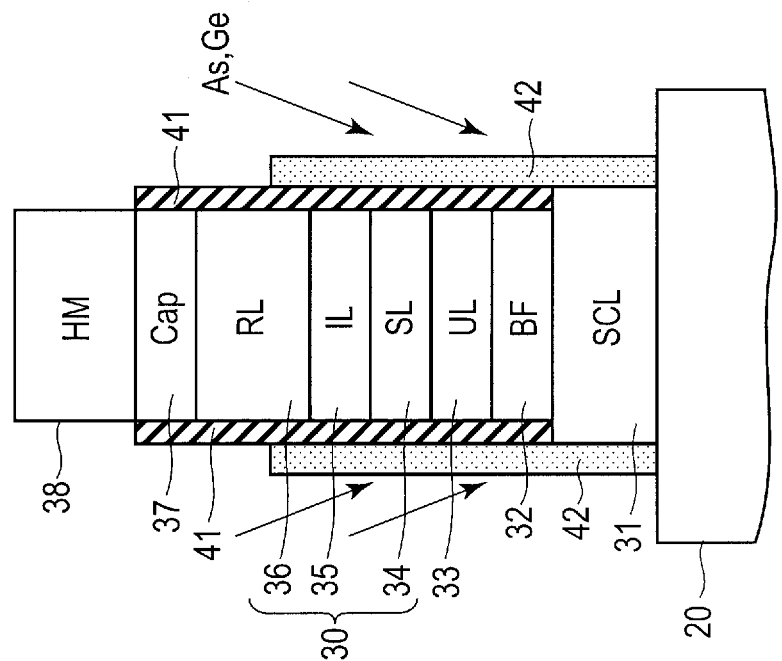
F I G. 3E
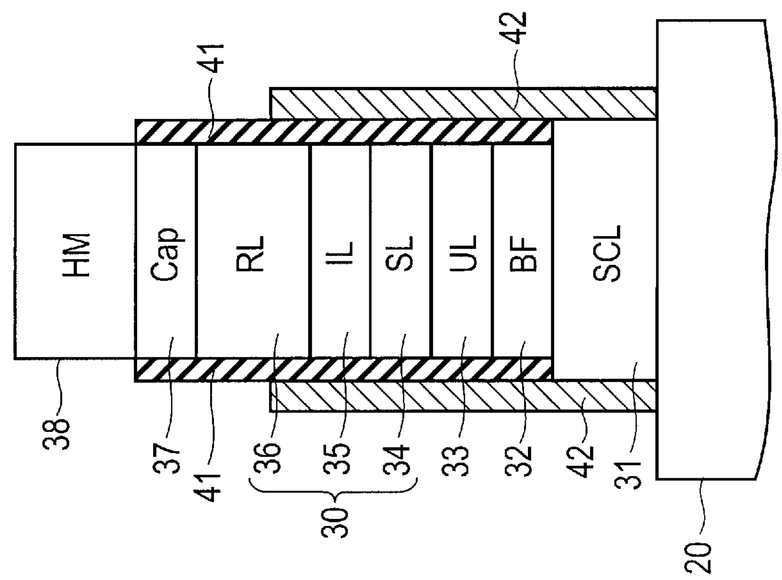
F I G. 3D

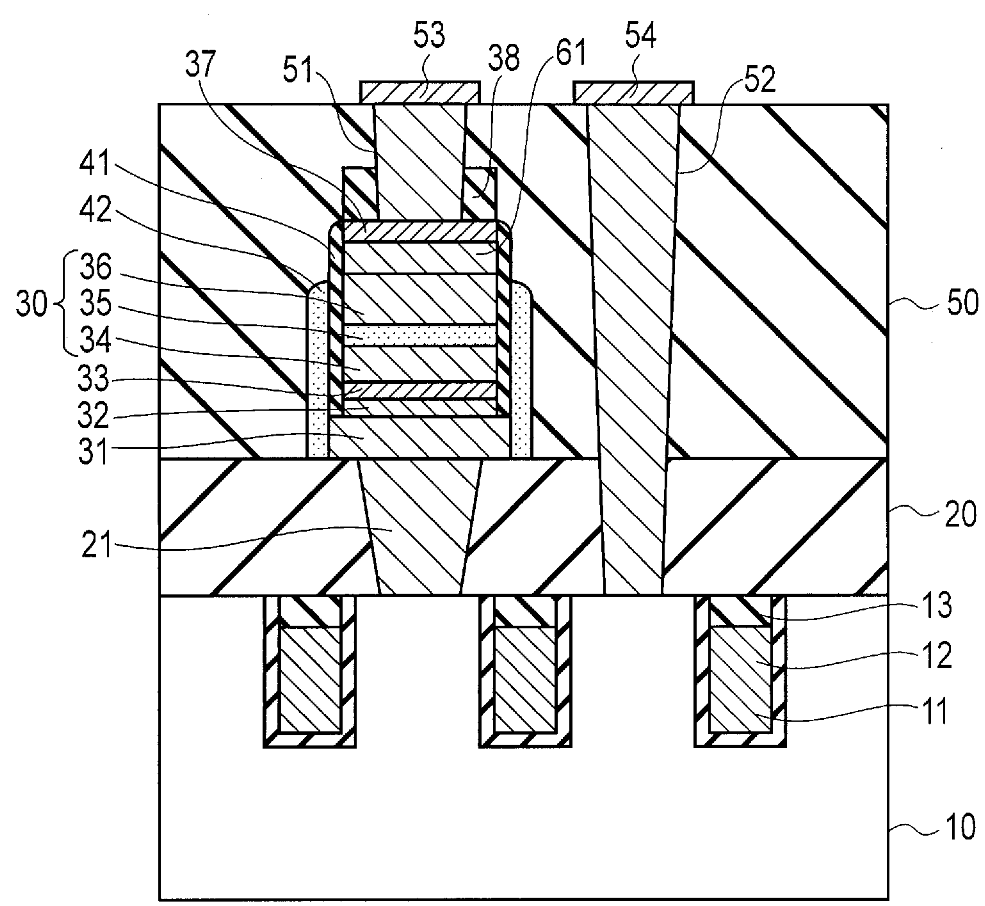
F I G. 6

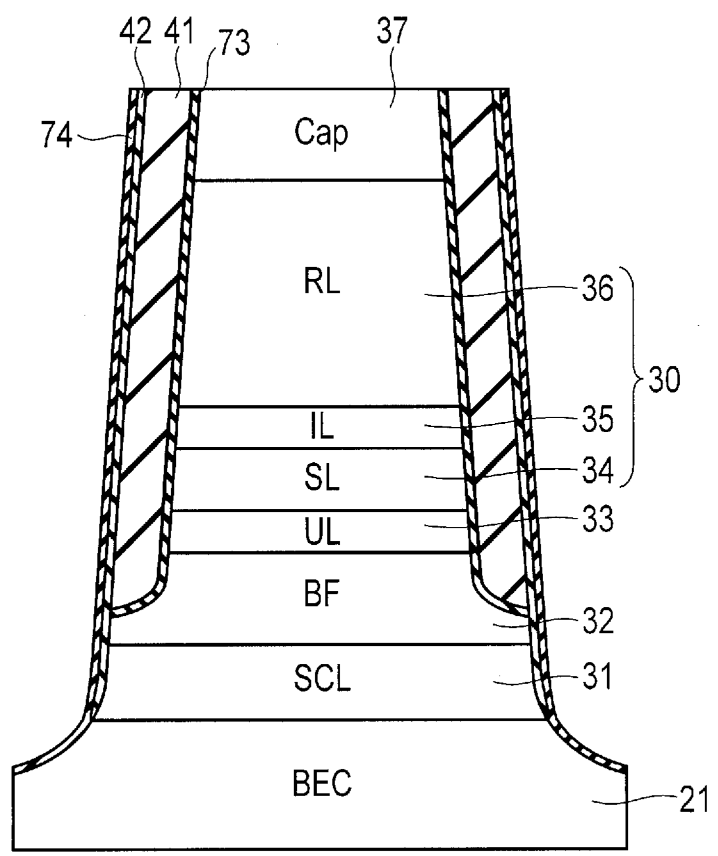
F I G. 7

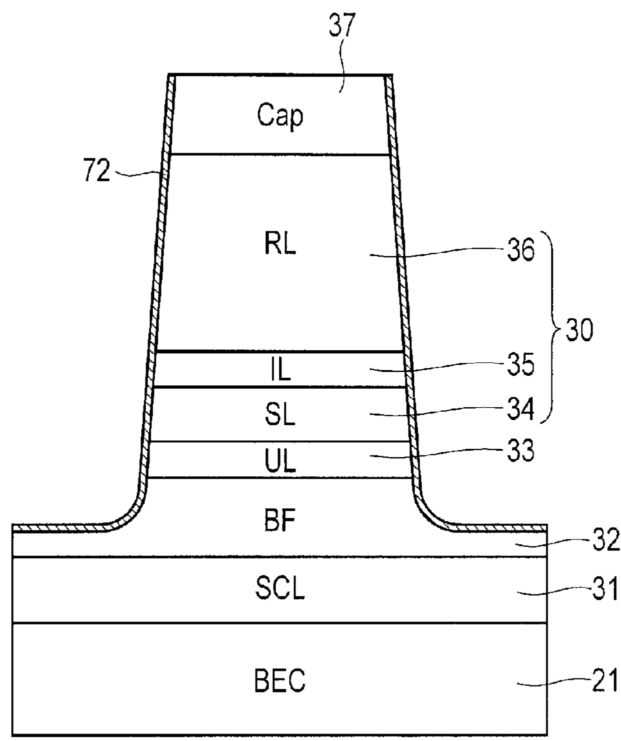
F I G. 8A
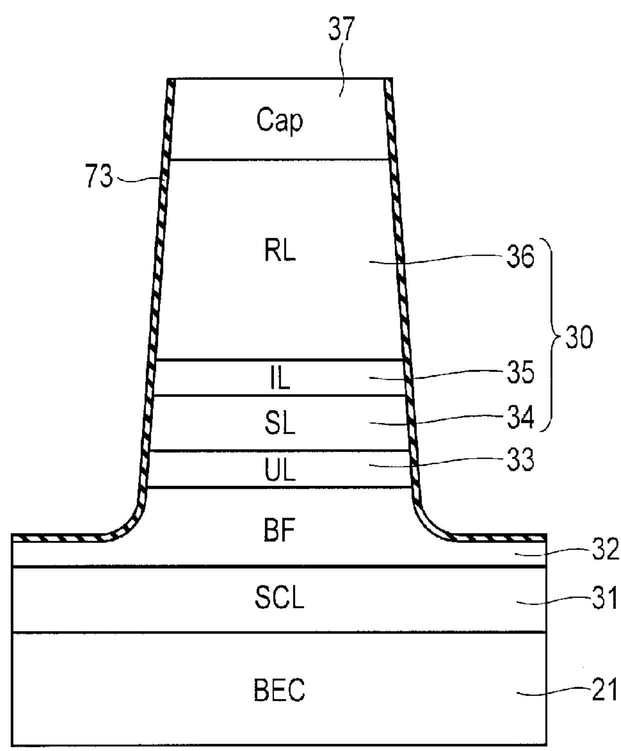
F I G. 8B

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/061,552, filed Oct. 8, 2014, the entire contents of which are incorporated herein by reference.

FIELD

Embodiments described herein relate generally to a magnetoresistive memory device and a manufacturing method of the same.

BACKGROUND

Magnetoresistive effect elements used in magnetoresistive memory devices such as a magnetic random access memory (MRAM) and the like are, generally, composed of a memory layer, a tunnel barrier layer on the memory layer, a reference layer on the tunnel barrier layer, and a shift adjustment layer on the reference layer.

When a size of a magnetoresistive effect element is reduced, a shift magnetic field from a reference layer affecting a memory layer increases. Thus, a shift adjustment layer must be thickened for sufficient shift canceling and secured stable performance of the element. On the other hand, when the size of a magnetoresistive effect element is reduced, the film thickness of the element must be reduced entirely because of a restriction in the processing point, and shift canceling becomes harder.

Thus, magnetoresistive effect elements which can cancel a magnetic field affecting a memory layer sufficiently while their film thickness can be reduced are demanded.

BRIEF DESCRIPTION OF THE DRAWINGS

FIG. 1 is a circuit structure which shows a memory cell array of an MRAM of first embodiment.

FIG. 2 is a cross-sectional view which shows the structure of the memory cell used in the MRAM of FIG. 1.

FIGS. 3A to 3E are cross-sectional views which show a manufacturing process of the memory cell of the MRAM of the first embodiment.

FIG. 6 is a cross-sectional view which shows a main structure of a memory cell of an MRAM of fourth embodiment.

FIG. 7 is a cross-sectional view which shows a main structure of a memory cell of an MRAM of fifth embodiment.

FIGS. 8A to 8D are cross-sectional views which show a manufacturing process of the memory cell of FIG. 7.

DETAILED DESCRIPTION

Figure 4B:
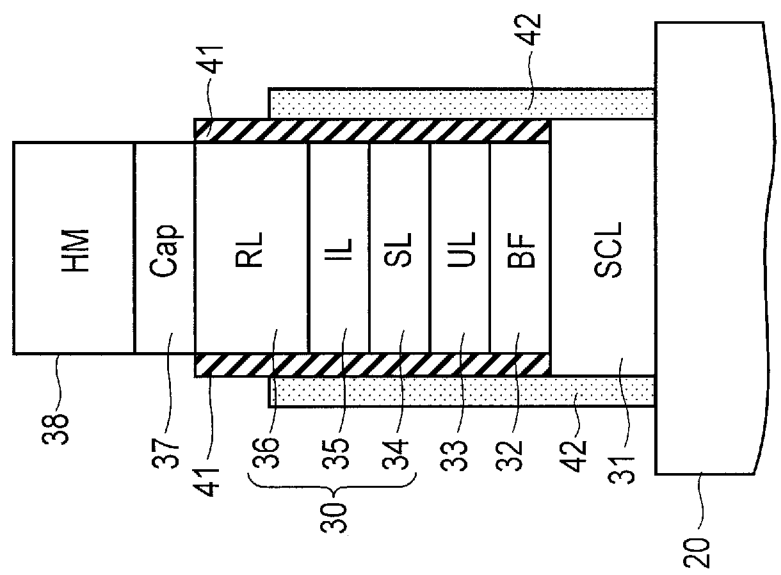
FIGS. 4A and 4B are cross-sectional views which show a manufacturing process of a memory cell of an MRAM of second embodiment.

In general, according to one embodiment, a manufacturing method of a magnetoresistive memory device comprises: forming a first magnetic layer on a substrate; forming a magnetoresistive effect element on the first magnetic layer; forming a mask on a part of the magnetoresistive effect element; selectively etching the magnetoresistive effect element using the mask; forming a sidewall insulating film on a sidewall of the magnetoresistive effect element exposed by the etching; selectively etching the first magnetic layer using the mask and the sidewall insulating film and forming a deposition layer containing a magnetic material on a sidewall of the first magnetic layer and the sidewall insulating film; and introducing ions into the deposition layer.

Hereinafter, embodiments are described in detail with reference to the accompanying drawings.

First Embodiment

FIG. 1 shows a circuit structure of a memory cell array of MRAM of the first embodiment.

Memory cell in memory cell array MA includes a series connection of an MTJ device used as a magnetoresistive memory element and a switching element (for example, a field-effect transistor [FET]) T. One end of the series connection (one end of the MTJ element) is electrically connected to a bit line BL while the other end of the series connection (one end of the switching element T) is electrically connected to a source line SL.

A control terminal of the switching element T, namely, a gate electrode of the FET or the like, is electrically connected to a word line WL. Electronic potential of the word line WL is controlled by a first control circuitry 1. Furthermore, electronic potential of the bit line BL and the source line SL is controlled by a second control circuitry 2.

FIG. 2 is a cross-sectional view which shows the structure of a memory cell used in the MRAM of the first embodiment.

A MOS transistor is formed on a surface of an Si substrate 10 for switching, and thereon, an interlayer insulating film 20 of $SiO_2$ or the like is formed. The transistor is structured as an embedded gate in which a gate electrode 12 is embedded in a groove provided with the substrate 10 via a gate insulating film 11. The gate electrode 12 is embedded to the middle of the groove, and on top of that, protective insulating film 13 of SiN or the like is formed. Furthermore, although this is not depicted in the Figure, p-type or n-type impurities are diffused at both sides of the embedded gate in the substrate 10 to form a source/drain region.

Note that the transistor may not necessarily include an embedded gate. For example, a gate electrode may be formed on the surface of the Si substrate 10 via a gate insulating film. The transistor may be structured optionally as long as it functions as a switching element.

A contact hole is formed in the interlayer insulating film 20 for a connection to the drain of the transistor, and a lower electrode (BEC) 21 is embedded inside the contact hole. The lower electrode 21 is formed of, for example, Ta.

A shift adjustment layer (SCL) 31 is formed on the lower electrode 21. The shift adjustment layer 31 includes a first atom which is a magnetic substance and a second atom which has an orbital angular momentum larger than that of the first atom. As the first atom, cobalt (Co) may be used. As the second atom, platinum (Pt) or a rare earth element may be used. The rare earth element may be terbium (Tb), holmium (Ho), dysprosium (Dy), or the like.

On the shift adjustment layer 31, the following layers are formed: a buffer layer 32 containing metal, an underlying layer (UL) 33 of AlN or the like, a recording layer (first magnetic layer, S1) 34 of CoFeB acting as a ferromagnetic magnetization free layer, a tunnel barrier layer (intermediate layer, IL) 35 of MgO, a reference layer (second magnetic layer, RL) 36 of CoFeB acting as a ferromagnetic magnetization fixed layer, a cap layer 37 of Ta, Ru, or the like, and a hard mask (HM) 38 of SiN or the like. That is, an MTJ element 30 in which the tunnel barrier layer 35 is held by two ferromagnetic layers 34 and 36 is created while the shift adjustment layer 31 is formed under the MTJ element 30 and the cap layer 37 and the hard mask 38 are formed above the MTJ element 30. Note that the buffer layer 32 and underlying layer 33 are used to simply promote the crystallization of the layer formed thereon and may be omitted.

The recording layer 34 should preferably be formed of a material exhibiting magnetic crystal anisotropy (for example, CoPd) or a material exhibiting magnetic interface anisotropy such as CoFeB (CFB)/oxide. The same applies to a material of the reference layer 36.

A sidewall insulating film 41 is formed on the side surfaces of the buffer layer 32 to the cap layer 37. Furthermore, a nonmagnetic deposition layer 42 is formed on the side surfaces of the shift adjustment layer 31 and the sidewall insulating film 41.

Here, while containing substances such as Co, Pt, and the like which are produced by etching of the shift adjustment layer 31, the deposition layer 42 is demagnetized by a treatment described later. This is because a retaining force remarkably decreases after the element is manufactured if the deposition layer 42 is a magnetic substance. The inventors of the present application have confirmed experimentally that the strength of the magnetic field of the element increases double when the deposition layer 42 is nonmagnetic as compared to the case where the deposition layer 42 is magnetic.

On the substrate on which the MTJ element 30 is formed, an interlayer insulating film 50 of $SiO_2$ or the like is further formed. Contact plug (TEC) 51 to be connected to the cap layer 37 on the MTJ element 30 is embedded in the interlayer insulating film 50. Furthermore, contact plug 52 to be connected to the source of the transistor is embedded in the interlayer insulating film 50 passing through both the interlayer insulating films 50 and 20. Then, on the interlayer insulating film 50, bit line (BL) 53 connected to the contact plug 51 and source line (SL) 54 connected to the contact plug 52 are formed.

Now, a manufacturing method of the memory cell shown in FIG. 2 is explained with reference to FIGS. 3A to 3E. Note that, the members from the shift adjustment layer 31 to the hard mask 38 are depicted in these Figures for the sake of simpler explanation.

Initially, as shown in FIG. 3A, the shift adjustment layer 31, buffer layer 32, underlying layer 33, recording layer 34, tunnel barrier layer 35, reference layer 36, cap layer 37, and hard mask 38 are formed on an underlying substrate, and then, the hard mask 38 is processed into an element pattern. The shift adjustment layer 31 is formed of, for example, CoPt.

Note that the underlying substrate is formed as follows. For example, an Si substrate 10 is prepared and a MOS transistor (not shown) is formed on the surface of the Si substrate 10. The MOS transistor includes an embedded gate and is for switching. Then, an interlayer insulating film 20 of $SiO_2$ or the like is deposited on the Si substrate 10 by CVD. Then, a contact hole is formed in the interlayer insulating film 20 to connect to the drain of the transistor, and a lower electrode (BEC) 21 formed of crystalline Ta is embedded into the contact hole. After that, the Ta film on the interlayer insulating film 20 is removed by chemical mechanical polishing (CMP) such that the Ta film is present only within the contact hole.

Next, as shown in FIG. 3B, selective etching is performed with respect to the cap layer 37 to the buffer layer 32 by ion beam etching (IBE) using, for example, Ar. Ion beam etching is a physical etching process using, mainly, movement energy of ions. Thus, unlike an RIE process, the IBE process does not easily produce a damaged layer due to a chemical reaction. Moreover, throughput is much high in the IBE process as compared to the RIE process. Thus, the manufacturing method of the present embodiment has an advantage in the productivity standpoint. In addition, since an Ar ion beam is irradiated from an oblique direction in the etching process of the present embodiment, a substance produced by the etching process can be prevented from accumulating on etching sidewalls.

Next, as shown in FIG. 3C, on the side surfaces exposed by the etching process, sidewall insulating film 41 is deposited. That is, the sidewall insulating film 41 of SiN is formed on the side surfaces of the buffer layer 32 to cap layer 37 by, for example, CVD or the like.

Then, as shown in FIG. 3D, the shift adjustment layer 31 is selectively etched by ion beam etching using the hard mask 38 and the sidewall insulating film 41 as a mask. At that time, the ion beam is irradiated vertically for preventing the removal of the sidewall insulating film 41. This way of ion beam irradiation causes the substance produced in the etching process to accumulate on the sidewalls of the shift adjustment layer 31 and the sidewall insulating film 41. The deposition substance 42 is a structural material of the shift adjustment layer 31 and thus is a magnetic layer.

Then, as shown in FIG. 3E, ions of As, Ge, or the like is injected into the deposition layer 42 to demagnetized the deposition layer 42. Although a specific mechanism of the demagnetization of the deposition layer 42 is unclear, a possible theory is that ions intrude between lattices by the ion injection such that the lattice intervals are deformed. Furthermore, the ion injection introduces an amorphous part into the deposition layer 42.

For ions in the ion injection, phosphorus (P), arsenic (As), antimony (Sb), boron (B), germanium (Ge), oxygen (O), and the like can be used.

Or, a plasma doping method may be used instead of the ion injection. In the plasma doping method, for example, $AsH_3$, $PH_3$, $BF_3$, and $B_2H_6$ are used as doping gas (source gas).

Then, the interlayer insulating film 50 is formed, and then contact plugs 51 and 52 are formed, and lines 53 and 54 are further formed thereon. Consequently, the structure shown in FIG. 2 is obtained.

As can be understood from the above, in the present embodiment, the shift adjustment layer 31 is formed below the MTJ element 30. Thus, a distance between the shift adjustment layer 31 and the recording layer 34 is shortened and the shift adjustment process can be performed efficiently. Therefore, a magnetic field affecting the recording layer 34 can be canceled sufficiently and the thickness of the shift adjustment layer 31 can be reduced.

Furthermore, since the deposition layer 42 formed on each side surface of the sidewall protection film 41 and the shift adjustment layer 31 is demagnetized, the retaining force can be prevented from decreasing after the element is manufactured and the performance of the element itself can be improved.

Moreover, in the present embodiment, the ion beam etching process is used for the treatment of the MTJ element 30 and the shift adjustment layer 31. Thus, the productivity is better as compared to a manufacturing method using an RIE process. Furthermore, since the ion beam is irradiated from an oblique direction in the treatment of the MTJ element 30, a substance produced by the etching process is prevented from accumulating on the etching sidewall. Furthermore, in the treatment of the shift adjustment layer 31, the ion beam is irradiated vertically and thus, the elimination of the sidewall insulating film 41 in the etching process of the shift adjustment layer 31 can be prevented.

Second Embodiment

Figure 4A:
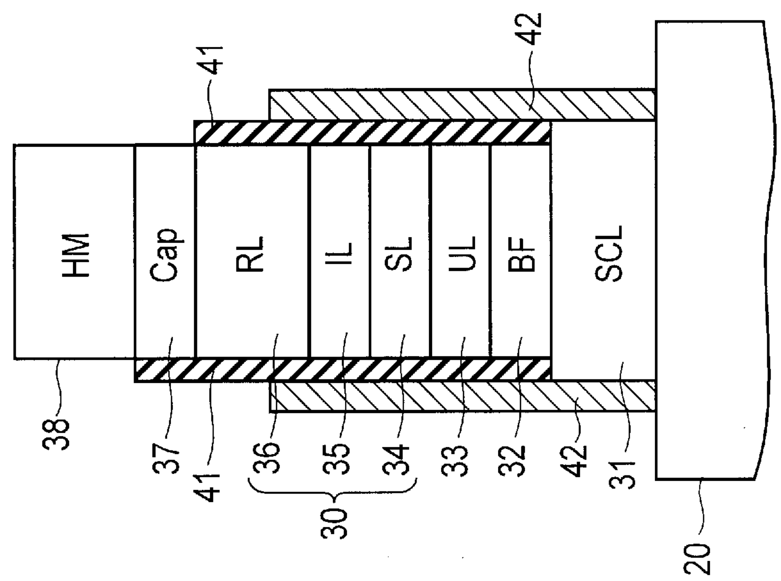

FIGS. 4A and 4B are cross-sectional views which show a manufacturing process of a memory cell of MRAM of second embodiment. Note that the structural elements already shown in FIGS. 3A to 3E are referred to by the same reference numbers and their detailed descriptions are omitted.

The present embodiment differs from the first embodiment in respect of performing oxidization of a deposition layer instead of ion injection into a deposition layer.

As shown in FIG. 4A, the processes shown in FIGS. 3A to 3D are performed the same in this embodiment, too. That is, on an underlying substrate, a shift adjustment layer 31, buffer layer 32, underlying layer 33, recording layer 34, tunnel barrier layer 35, reference layer 36, cap layer 37, and hard mask 38 are formed. Then, selective etching is performed from the cap layer 37 to the underlying layer 33 using the hard mask 38. Then, a sidewall insulating film 41 is deposited on the side surfaces those have been exposed by etching. After that, the shift adjustment layer 31 is selectively etched by ion beam etching using the hard mask 38 and the sidewall insulating film 41 as a mask. At that time, a substance produced by the etching process of the shift adjustment layer 31 accumulates on each side surface of the sidewall insulating film 41 and the shift adjustment layer 31.

Next, as shown in FIG. 4B, the deposition layer 42 is oxidized by, for example, a treatment in an oxidizing atmosphere. Through this oxidization process, the deposition layer 42 is demagnetized. Although the specific mechanism of the demagnetization of the deposition layer 42 is unclear, a possible explanation is that the coupling model of the deposition layer 42 is deformed by the oxidization treatment and a compound is formed.

As can be understood from the above, in the present embodiment, the deposition layer 42 formed on each side surface of the sidewall protection film 41 and the shift adjustment layer 31 is demagnetized by the oxidization process. Therefore, the strength of the magnetic field after the manufacture of the element can be prevented from decreasing and the performance of the element itself can be improved. Thus, the advantages obtained in the first embodiment can likewise be achieved.

Third Embodiment

Figure 5B:
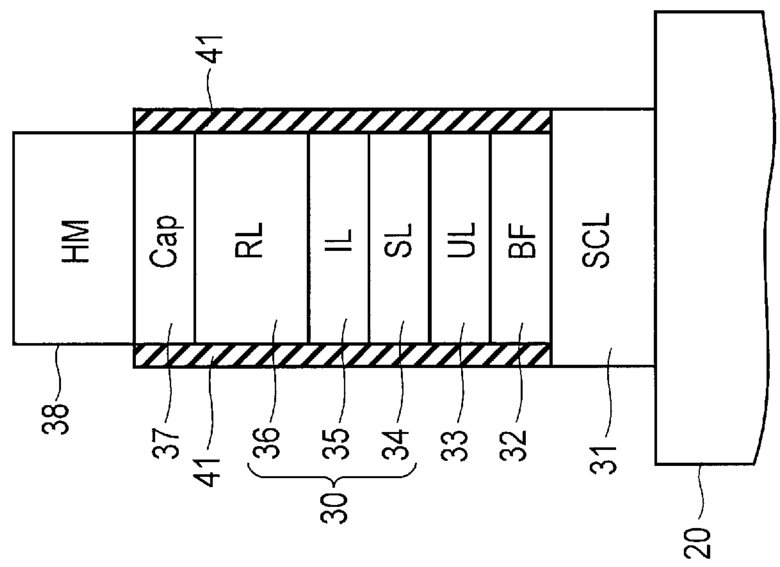
FIGS. 5A and 5B are cross-sectional views which show a manufacturing process of a memory cell of an MRAM of third embodiment.
Figure 5A:
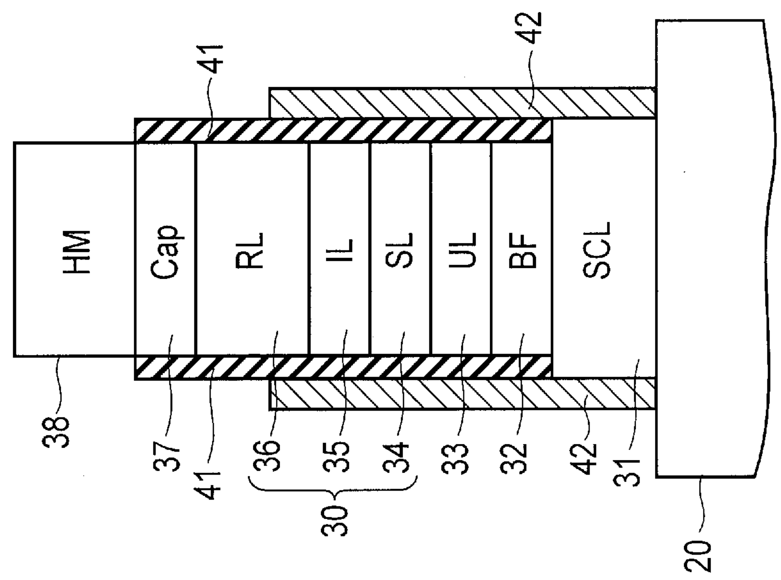

FIGS. 5A and 5B are cross-sectional views which show a manufacturing process of a memory cell of MRAM of third embodiment. Note that the structural elements already shown in FIGS. 3A to 3E are referred to by the same reference numbers and their detailed descriptions are omitted.

The present embodiment differs from the first embodiment in respect of performing etching for removal of a deposition layer instead of ion injection.

As shown in FIG. 5A, the processes shown in FIGS. 3A to 3D are performed the same in this embodiment, too. That is, as in FIG. 4A, FIG. 5A shows that the layers 31 to 37 are each selectively etched and a deposition layer 42 is formed on each side surface of the sidewall insulating film 41 and the shift adjustment layer 31.

Next, as shown in FIG. 5B, the deposition layer 42 is removed by the ion beam etching using Ar. Note that, for effective etching, the ion beam is irradiated obliquely. Furthermore, to prevent a complete removal of the sidewall insulating film 41 by the ion beam irradiation, the thickness of the sidewall insulating film 41 is set greater than the thickness of the deposition layer 42.

As can be understood from the above, in the present embodiment, the deposition layer 42 formed on each side surface of the sidewall protection film 41 and the shift adjustment layer 31 is removed by the ion beam etching process. Therefore, such an inconvenience that a magnetic layer exists on the side surface of the shift adjustment layer 31 can be eliminated. Therefore, as in the case where the deposition layer 42 on the side surface of the shift adjustment layer 31 is demagnetized, the strength of the magnetic field after the manufacture of the element can be prevented from decreasing and the performance of the element itself can be improved. Thus, the advantages obtained in the first embodiment can be achieved.

Fourth Embodiment

FIG. 6 is a cross-sectional view which shows a main structure of a memory cell of MRAM of fourth embodiment. Note that the structural elements already shown in FIG. 2 are referred to by the same reference numbers and their detailed descriptions are omitted.

The present embodiment differs from the first embodiment in respect of shift adjustment layers formed above and below an MTJ element instead of only one shift adjustment layer formed below the MTJ element. That is, on a substrate, a first shift adjustment layer (SCL) 31 is formed, and on that, a buffer layer (BF) 32, underlying layer (UL) 33, ferromagnetic recording layer (SL) 34, tunnel barrier layer (IL) 35 of MgO, ferromagnetic reference layer (RL) 36, and cap layer 37 are formed. Then, on the cap layer 37, a second shift adjustment layer (SCL) 61 is formed, and on that, a hard mask (HM) 38 is formed.

A sidewall insulating film 41 is formed by CVD or the like on each etching side surface of the buffer layer 32 and the cap layer 37 including the upper side shift adjustment layer 61. The deposition layer 42 is, as in the first embodiment, formed on each side surface of the sidewall insulating film 41 and the shift adjustment layer 31.

In such a structure, the deposition layer 42 is demagnetized by the ion injection treatment or the oxidation treatment, and thus, the advantage obtained in the first embodiment can be obtained similarly. Furthermore, as in the third embodiment, the same advantage is obtained by removing the deposition layer 42 instead of the demagnetization thereof.

Furthermore, in the present embodiment, the shift adjustment layer 61 is additionally provided with the upper side, and thus, the lower side shift adjustment layer 31 can be made thinner. This eases the treatment of the lower side shift adjustment layer 31. Furthermore, the thickness of a substance produced in the etching process of the shift adjustment layer 31, that is, the thickness of the deposition layer 42 can be reduced. This is another advantage.

Fifth Embodiment

FIG. 7 is a cross-sectional view which shows a main structure of a memory cell of MRAM of fifth embodiment. Note that the structural elements already shown in FIG. 2 are referred to by the same reference numbers and their detailed descriptions are omitted.

The present embodiment differs from the first embodiment in respect of a deposition layer 73 formed on a sidewall of an MTJ element 30 and a deposition layer 74 formed on a side surface of a deposition layer 42. That is, a shift adjustment layer (SCL) 31 is formed on a lower electrode (BEC) 21 of Ta, and on that, a buffer layer (BF) 32 containing a metal is formed. On the buffer layer 32, as in the first embodiment, an underlying layer (UL) 33, recording layer (SL) 34, tunnel barrier layer (IL) 35, reference layer (RL) 36, and cap layer 37 are formed.

The buffer layer 32 to the cap layer 37 are formed in, for example, a pillar shape and a sidewall insulating film 41 of SiN is formed on the side surface of the pillar via a deposition layer 73 of a metal oxide film. Furthermore, the lower electrode 21 and the shift adjustment layer 31 are formed in a pillar shape whose diameter is slightly larger than the pillar of the buffer layer 32 to the cap layer 37. Then, on each side surface of the lower electrode 21 and the shift adjustment layer 31 and on a side surface of the sidewall insulating film 41, the deposition layer 42 containing a magnetic substance used as a structural material of the shift adjustment layer 31 and a deposition layer 74 containing Ta are formed.

In such a structure, the deposition layer 42 is subjected to a demagnetization treatment, and the advantage obtained in the first embodiment can be achieved, too.

FIGS. 8A to 8D are cross-sectional views which show a manufacturing process of the memory cell shown in FIG. 7.

Initially, as shown in FIG. 8A, on the lower electrode 21 of Ta, the shift adjustment layer 31, buffer layer 32 containing a metal, underlying layer 33, recording layer 34, tunnel barrier layer 35, reference layer 36, and cap layer 37 are layered. Then, selective etching is performed from the cap layer 37 to reach the buffer layer 32 for forming a pillar MTJ element pattern. At that time, a metal film 72 used as a structural material of the buffer layer 32 is adhered to the side surface of each of layers 32, 33, 34, 35, 36, and 37.

Next, as shown in FIG. 8B, the buffer layer is subjected to an oxidization process to form a metal oxide film (deposition layer) 73 on a side surface of each of the layers 32, 33, 34, 35, 36, and 37.

Figure 8C:
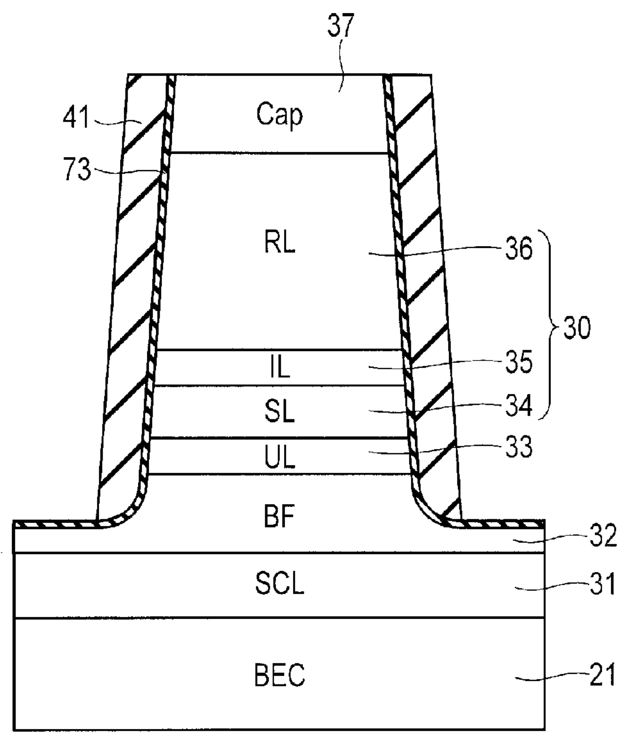

Then, as shown in FIG. 8C, an SiN film is deposited by CVD or the like to form a sidewall insulating film 41 on a side surface of each of the layers 32, 33, 34, 35, 36, and 37.

Figure 8D:
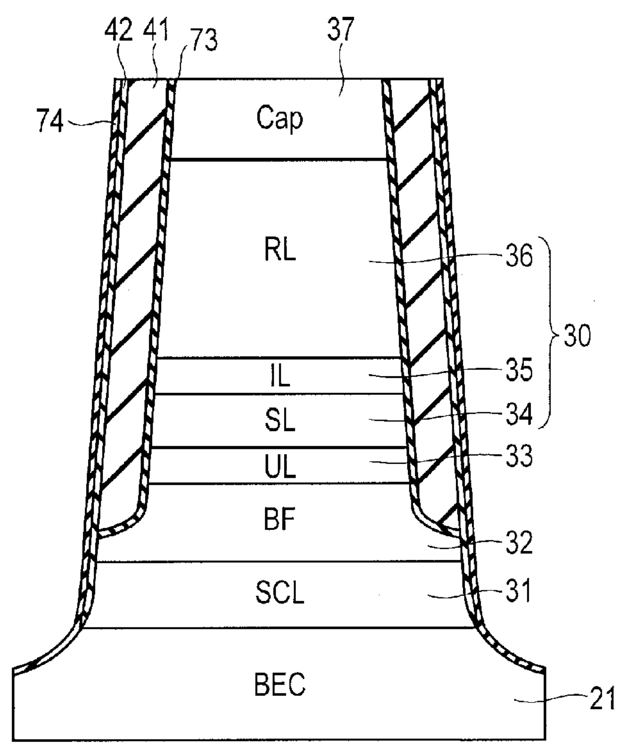

Then, as shown in FIG. 8D, the shift adjustment layer 31 is selectively etched to reach the lower electrode 21. When the shift adjustment layer 31 is etched, a nonmagnetic deposition layer 42, which is produced in the etching process of the shift adjustment layer, is formed on the side surface of the shift adjustment layer 31 and on the sidewall insulating film 41. Furthermore, when the etching process proceeds and the lower electrode 21 is etched, the deposition layer 74 containing Ta is formed on each side surface of the shift adjustment layer 31 and the lower electrode 21 and on the deposition layer 42.

Through such a process, the sidewalls include, from its inner side to its outer side, the deposition layer 73 of a metal oxide film, sidewall insulating film 41 of SiN, deposition layer 42 containing a magnetic material, and deposition layer 74 of Ta in this order. Note that, when the shift adjustment layer 31 and the lower electrode 21 are etched, a process to remove the deposition layer 42 may be added. For example, as in the third embodiment, the deposition layer 42 may be removed by ion beam etching after the etching of the shift adjustment layer 31 and then, the lower electrode 21 may be etched.

Sixth Embodiment

Figure 9:
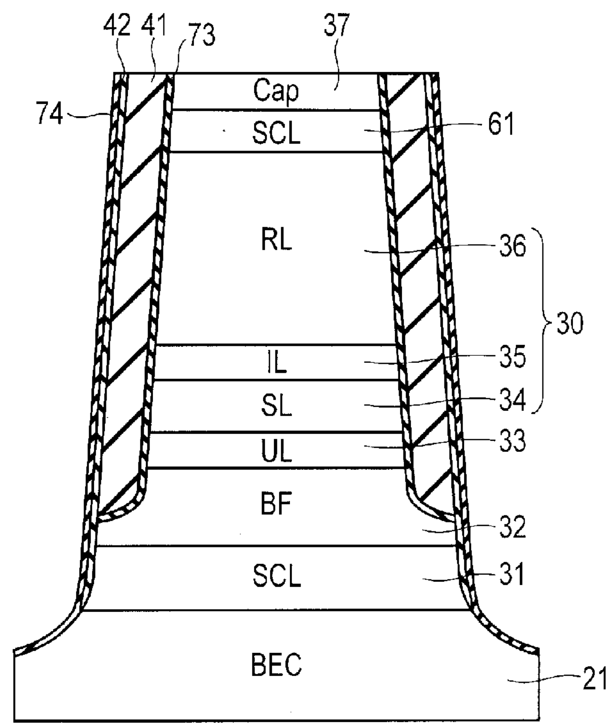
FIG. 9 is a cross-sectional view which shows a main structure of a memory cell of an MRAM of sixth embodiment.

FIG. 9 is a cross-sectional view which shows a main structure of a memory cell of MRAM of sixth embodiment. Note that the structural elements already shown in FIG. 7 are referred to by the same reference numbers and their detailed descriptions are omitted.

The present embodiment differs from the fifth embodiment in respect of shift adjustment layers arranged on both sides of an MTJ element. That is, in addition to the structure shown in FIG. 7, a shift adjustment layer 61 is formed between a reference layer 36 and a cap layer 37.

The above structure is manufactured by substantially the same method as in the fifth embodiment, and the sidewalls are formed similarly to those in the fifth embodiment. Thus, the advantage obtained in the fifth embodiment can be obtained here, too. Note that the deposition layer 42 may be removed by ion beam etching or the like as mentioned in the fifth embodiment.

Seventh Embodiment

Figure 10:
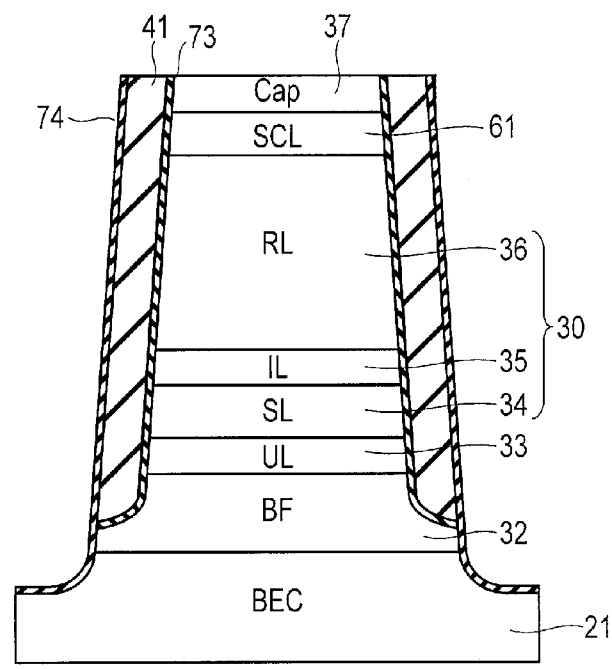
FIG. 10 is a cross-sectional view which shows a main structure of a memory cell of an MRAM of seventh embodiment.

FIG. 10 is a cross-sectional view which shows a main structure of a memory cell of MRAM of seventh embodiment. Note that the structural elements already shown in FIG. 7 are referred to by the same reference numbers and their detailed descriptions are omitted.

The present embodiment differs from the fifth embodiment in respect of a shift adjustment layer formed below an MTJ element, not above it. That is, a buffer layer 32 is formed on the lower electrode 21, and on that, an underlying layer 33, recording layer 34, tunnel barrier layer 35, reference layer 36, shift adjustment layer 61, and cap layer 37 are formed.

In the structure of the present embodiment, a deposition layer 42 is not formed on a side surface, and the side surface is layered by, from its inner side to its outer side, a deposition layer 73 of a metal oxide film, SiN sidewall insulating film 41, and Ta deposition layer 74 in this order.

Modification

Note that the present invention is not limited to the above embodiments.

Materials for the shift adjustment layer may be replaced with other materials as long as they can cancel a magnetic field affecting the recording layer. In addition, materials for the other layers may be changed arbitrarily as needs be.

Moreover, a method for selectively etching an MTJ element is not limited to ion beam etching alone, and may be RIE. Similarly, a method for etching a deposition layer is not limited to ion beam etching alone, and may be RIE.

In the embodiments, a problem is that a deposition layer which is a substance produced by etching of the shift adjustment layer becomes magnetic; however, the deposition layer becomes magnetic not only when the shift adjustment layer is etched but also when a magnetic layer is etched. Thus, the embodiments can be applied to a structure of a magnetoresistive effect element with a magnetic layer at its lower side in addition to the structure of the magnetoresistive effect element with a shift adjustment layer at its lower side.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device, comprising:

a first magnetic layer including a first metal provided on a substrate;

a first nonmagnetic layer provided on the first magnetic layer;

a layered structure including a second magnetic layer provided on the first nonmagnetic layer, a second nonmagnetic layer, and a third magnetic layer;

a first sidewall insulating film covering a part of a sidewall of the layered structure; and a second sidewall insulating film provided on the first sidewall insulating film, wherein the second sidewall insulating film includes the first metal and is in contact with the first magnetic layer.

2. The device of claim 1, wherein the first sidewall insulating film is an SiN film.

3. The device of claim 1, wherein a lateral dimension of the first magnetic layer is larger than a lateral dimension of the first nonmagnetic layer, where the lateral dimension is in a cross section parallel to a stacking direction of the first nonmagnetic layer and the first nonmagnetic layer.

4. The device of claim 1, wherein the first magnetic layer and the first nonmagnetic layer have a pillar shape, a diameter of the first magnetic layer is larger than a diameter of the first nonmagnetic layer.

5. The device of claim 1, wherein the first metal is Co or Pt.

6. The device of claim 1, wherein the second sidewall insulating film contains oxygen.

7. The device of claim 1, wherein the layered structure includes the second magnetic layer, the second nonmagnetic layer, the third magnetic layer and a fourth magnetic layer, which are stacked in this order.

8. The device of claim 1, wherein the second magnetic layer is a recording layer, the second nonmagnetic layer is a tunnel barrier layer and the third magnetic layer is a reference layer.

9. The device of claim 1, wherein the first nonmagnetic layer includes a second metal, and an interfacial layer provided between a sidewall of the layered structure and an interface of the first sidewall insulating film includes the second metal.

10. The device of claim 9, wherein the interfacial layer contains oxygen.

11. The device of claim 1, further comprising:

a lower electrode including another metal provided on a bottom surface of the first magnetic layer.

12. The device of claim 11, wherein a side surface of the second sidewall insulating film includes said another metal.

13. The device of claim 11, wherein said another metal is Ta.

* * * * *